June 12, 1951 | D. I. WILBUR | 2,556,993

BEAT FREQUENCY OSCILLATOR

Filed Feb. 28, 1950 | 2 Sheets-Sheet 1

Inventor.
Donald I. Wilbur.
By. Schroeder, Merriam, Hofgren & Brady.
Attorneys

June 12, 1951 D. I. WILBUR 2,556,993

BEAT FREQUENCY OSCILLATOR

Filed Feb. 28, 1950 2 Sheets-Sheet 2

Inventor.
Donald I. Wilbur.
By Schroeder, Merriam
Hofgren & Brady.
Attorneys

Patented June 12, 1951

2,556,993

UNITED STATES PATENT OFFICE 2,556,993

BEAT FREQUENCY OSCILLATOR

Donald I. Wilbur, Warrenville, Ill., assignor to The Hallicrafters Co., a corporation of Illinois Application February 28, 1950, Serial No. 146,766

15 Claims. (Cl. 250—36)

This invention relates to a beat frequency oscillator, and more particularly to a beat frequency oscillator comprising a stage normally used for amplification in radio apparatus.

One feature of this invention is that it provides an improved beat frequency oscillator; another feature of the invention is that it provides an amplifier tube having grid and anode elements and having at least one tuned circuit coupled thereto, and means external of said tube providing capacitive coupling between said grid and anode elements to cause said tube to oscillate, together with switch means for selectively grounding the means providing the capacitive coupling to remove said coupling and cause said oscillations to cease; a further feature of the invention is that the capacitive coupling has a capacitive value not in excess of 1% of the capacitive component of said tuned circuit, not in excess of one micromicrofarad, and further preferably of the order of .2 micromicrofarads; an additional feature of the invention is that the capacitive coupling which causes oscillation is so small relative to the capacitive components of the tuned circuits associated with the tube that the oscillation frequency is displaced from the resonant frequency of said tuned circuits by a frequency in the audible range and within the acceptance selectivity pattern of said tuned circuits; yet a further feature of the invention is that the means providing the capacitive coupling may comprise a wire conductor extending adjacent the grid and anode terminals of the tube, but spaced and electrically insulated therefrom; yet another feature of the invention is that the desired spacing of the conductor may be provided by insulation encasing said conductor; still an additional feature of the invention is that a single conductor may provide coupling between the grid and anode and also may provide a connection to said switch means; and still a further feature of the invention is that the switch means is connected to ground, thereby permitting the use of a small, light switch which may be located at any point on the chassis of the radio, inasmuch as no voltages are present which would require heavy insulation or which would disturb other electrical circuits of the radio.

Figure 1:
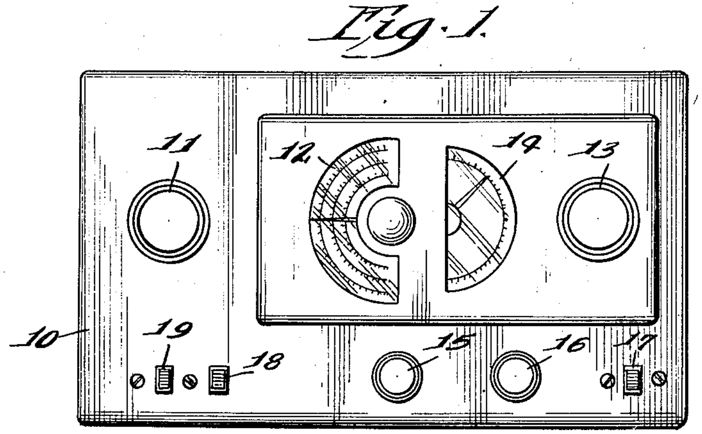
Figure 2:
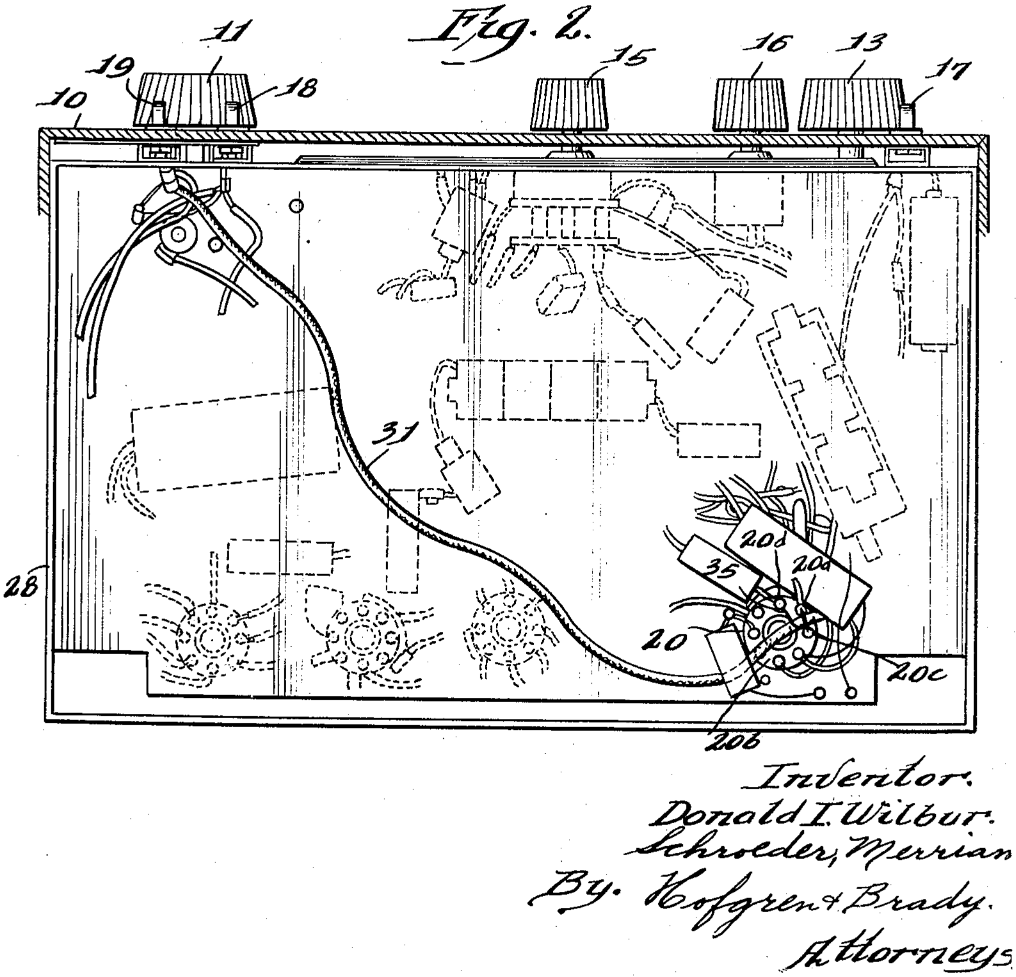
Figure 3:
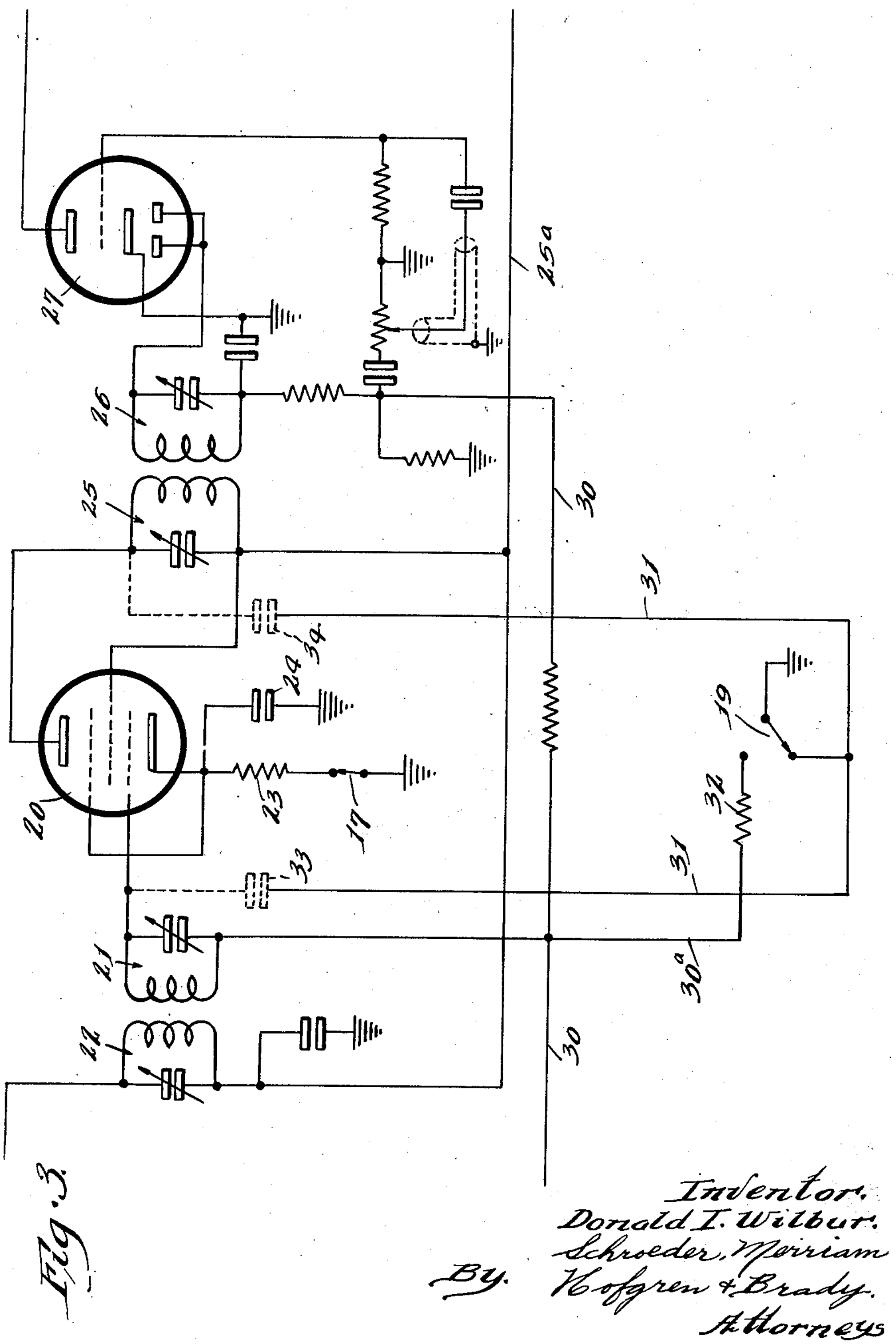

Other features and advantages will be apparent from the following description, and from the drawings in which:

Fig. 1 is a front elevational view of a communications type receiver embodying the invention; Fig. 2 is an enlarged bottom plan view of the receiver of Fig. 1, portions of the cabinet and wiring and certain electrical components being broken away or shown fragmentarily; and Fig. 3 is a schematic wiring diagram of a portion of the circuit of the receiver of Fig. 1, including the invention.

In many radio applications, and particularly in a communications type receiver, it is desirable to provide an ordinary superheterodyne receiving circuit for receiving modulated waves, as for example voice signals or code signals wherein the signal comprises a modulation effect on a carrier wave. Such a superheterodyne circuit may or may not comprise one or more stages of radio amplification, and normally comprises a continuously operating local oscillator, a mixer wherein the receiving signal is heterodyned with waves from the local oscillator, one or more stages of intermediate frequency amplification, a second or audio detector, one or more stages of audio amplification, and transducing means, as a speaker.

In such a receiver it is not possible to detect unmodulated carrier waves of the type wherein keying at the transmitter merely interrupts (but does not modulate) the carrier wave to provide a code signal (hereinafter termed "CW"), unless another oscillator, known as a "beat frequency oscillator" is utilized to provide waves to heterodyne with the unmodulated carrier waves and provide a wave of a frequency displaced from the carrier wave by a frequency in the audible range. Of course, this audible wave may be provided at any of various points in a receiver, and waves from the beat frequency oscillator may be caused to heterodyne with the carrier wave while the carrier wave is at its original transmitted frequency or after the carrier has been converted to some lower or intermediate frequency.

In the past it has been commercial practice to provide a separate beat frequency oscillator similar to the separate local oscillator of the receiver, but differing in frequency from the carrier signal by a frequency in an audible range. The provision of such a separate oscillator adds considerably to the cost of the receiver, and also adds to the size of the receiver, since such a separate oscillator requires a separate tube and associated circuits.

It has been long known that a tube normally used as an amplifier may be caused to oscillate by providing feedback in the form of capacitive coupling between the anode and grid thereof. Such feedback arrangements to provide beat frequency oscillations have not proved to be practical in commercial receivers for various reasons. In the first place, the provision of a feedback condenser and a switch to throw the condenser in and out of the circuit as desired have had unexpected and undesired effects on other portions of the receiver circuit, since the condenser was coupled to the anode, and some of the leads carried the high anode voltage. In addition to necessitating a relatively expensive, heavily insulated switch capable of carrying the high anode voltage, it was necessary to locate the condenser and switch very closely adjacent the circuits of the tube wherein the feedback was provided in order to minimize as much as possible undesired effects upon other parts of the circuit, caused by coupling of the varying anode voltage with such other parts of the circuit.

This restriction upon the location of the parts is in itself very undesirable commercially, because the switch which controls beat frequency oscillations should be located on the front panel near the other controls, but if the feedback is applied in the circuit of an intermediate frequency amplifier tube (the most advantageous place), long leads are required between the tube and the switch, because in the construction of a receiver the intermediate frequency amplifier tubes and circuits are most advantageously placed at the rear of the chassis. These intermediate frequency circuits are not tunable during the operation of the receiver, and it is desirable to place the tunable circuits (as for example the radio frequency amplifier and tunable oscillator circuits) at the front of the chassis where they are adjacent the controls on the front panel.

In the present invention, this serious commercial disadvantage is completely overcome, inasmuch as there is no high voltage in the added lead or in the switch, and a small light switch may be used and the length of the connecting lead to the switch is of absolutely no importance, because when the circuit is not used as a beat frequency oscillator the lead is connected directly to ground and in electrical effect becomes merely a part of the chassis and does not interact with other circuit components to cause oscillations or other undesired effects.

In a communications type receiver, the intermediate frequency signal generally is of the order of 455 kilocycles, and the intermediate frequency circuits have capacitive components of the order of 80 micromicrofarads. Consequently, utilizing a normal commercially obtainable condenser to provide feedback coupling in an intermediate frequency amplifier stage would add so much capacity relative to the capacitive component of the tuning circuits that the beat frequency produced would be displaced substantially from the carrier frequency (the carrier frequency in this case being the I. F. frequency), so that a relatively low audio frequency not in excess of the order of one kc. could not be provided without adding expensive, specially designed condenser arrangements. Furthermore, adding a relatively large amount of capacitive coupling to produce beat frequency oscillations would cause the tube to oscillate more strongly than desired, weakening the I. F. gain of the desired signal.

Because of these disadvantages, there has never been a commercial arrangement wherein capacitive coupling between the anode and grid of an intermediate frequency amplifier tube has been utilized to provide beat frequency oscillations when desired.

I have devised and am herewith disclosing and claiming an improved beat frequency oscillator wherein means external of a tube which is normally an amplifier are utilized to provide capacitive coupling between the grid and anode elements of the tube to cause the tube to oscillate, said coupling having a capacitive value not in excess of 1% of the capacitive component of the tuned circuit associated with the tube. The capacitive coupling is not in excess of one micromicrofarad, and preferably is of the order of .2 micromicrofarad, so that the beat frequency oscillations are displaced from the I. F. frequency by only a small amount, as for example 500 or 1000 cycles. In addition to providing an audible beat frequency note, this small frequency displacement enables use of the beat frequency oscillator without detuning the receiver, or conversely, the carrier can be located with the beat frequency oscillator on, and then the beat frequency oscillator may be switched off without detuning the receiver.

An important feature of the invention is that no high voltages are present in the beat frequency arrangement, and the arrangement is cut off merely by grounding a lead. Consequently, the lead is effectively removed and cannot affect other circuits in any manner. There is never any high voltage present in the lead.

The means providing the capacitive coupling may comprise a wire conductor extending adjacent the grid and anode terminals, but spaced and electrically insulated therefrom. The conductor may extend to one terminal a simple, light switch mounted at any desired point on the chassis or on the front panel of the cabinet, and the other terminal of the switch is connected to ground, so that when the beat frequency arrangement is disconnected, the wire conductor is merely a grounded lead that has no effect on other circuits in the receiver. When the switch is open, the ungrounded lead provides a very small capacitive coupling between the anode and grid of the tube sufficient to throw the tube into oscillation. These oscillations are not so strong as to minimize gain in the tube, but the system is exceedingly stable because of the grounding arrangement.

Referring now more particularly to the drawings, a communications type receiver is shown in Fig. 1, having a front panel 10 upon which the controls which are used during operation are mounted. A main tuning control 11 is used in conjunction with a main tuning dial 12 in conventional manner, and a band spread tuning control 13 is used in conjunction with a band spread tuning dial 14. Any one of a plurality of tuning bands may be selected by a band selector switch control 15, and the volume and off-on switch control is shown at 16. Other controls include a receive-standby switch control 17, a speaker-phones control 18, and a control 19 for switching between modulated signal and C. W. signal reception. When the control 19 is in position to receive modulated signals, the circuit is arranged for normal superheterodyne operation, and when this switch is in position to receive C. W. signals, beat frequency oscillations are provided.

Fig. 3 shows the circuit in which these beat frequency oscillations are provided. An intermediate frequency amplifier tube 20, which may be of tube type No. 12SK7, is shown as a pentode having cathode, control grid, screen grid, suppressor grid, and anode elements. Each of these elements is connected in the tube to a different terminal which projects from the bottom of the tube, and the tube is mounted in a tube socket in a chassis 28 as shown in Fig. 2. The tube would also have a heating element and connections thereto. These are not illustrated since they are conventional.

A tuned input circuit which is designated generally at 21 is coupled to the control grid of the tube 20, it being understood that the tube 20 is an intermediate frequency amplifier tube and may be preceded by one or more stages of radio amplification in which the transmitted carrier wave is heterodyned with a wave generated by a local oscillator to convert the carrier to an intermediate frequency, as for example, a frequency of 455 kc. The preceding circuits may be conventional, and in Fig. 3 only the coupling means between these circuits and the input circuit of the tube 20 is shown. This coupling means comprises a tuned circuit, designated generally at 22, which may comprise the output circuit of the radio amplifier or mixer tube.

The cathode of the tube 20 is connected to ground through a cathode resistor 23 in series with the receive-standby switch 17, and by-pass condenser 24 is provided, as is conventional. The anode of the tube 20 is coupled to a tuned output circuit designated generally at 25, the lower end of this circuit (as the parts appear in the drawing) being connected to a lead 25*a* which is in turn connected to a B+ supply, not shown.

The tuned circuits 21 and 25 are pre-tuned to the same resonant frequency, as for example 455 kc., and each of these tuned circuits comprises an inductive component and a capacitive component. The condensers providing the capacitive component are shown in the drawing as being variable, although it will be understood that these condensers normally are not varied or tuned during the operation of the receiver, but are variable in order to provide initial adjustment or proper alignment of the intermediate frequency circuits of the receiver.

The output circuit 25 is coupled to an input circuit designated generally at 26, which in turn is coupled to a detector and audio amplifier tube 27. The tube 27 has a pair of diode anodes which are connected together and form part of an automatic volume control circuit (A. V. C.) which is connected through a lead 30 with the intermediate frequency amplifier input circuit 21 and also with the radio frequency circuits which precede the intermediate frequency amplifier stage.

The tube 20 has a low anode-grid capacitance, a pentode tube of this type having its anode shielded from the other tube elements by the suppressor grid, so that the interelectrode capacitance normally does not exceed .003 micromicrofarad. Furthermore, the metal tube base provides an additional shielding effect between the anode and the grid leads within the tube, a tube of this type being constructed to include interlead shielding within the base.

Inasmuch as the internal feedback or interelectrode capacitance of the tube is so low, the tube normally does not oscillate, but acts as an amplifier. In order to utilize the tube as a beat frequency oscillator, means external of the tube are utilized to provide capacitive couplings between the grid and anode elements, to cause the tube to oscillate. This means is shown diagrammatically in Fig. 3 as a lead 31 connected to one stationary terminal of the switch 19, the movable pole of this switch being grounded so that, with the switch in the position shown in Fig. 3, lead 31 is merely a ground lead. Another stationary terminal of the switch 19 is connected to the A. V. C. lead 30 by means of a lead 30*a* which incorporates a resistor 32. With the switch in the position other than that shown in the drawing, the A. V. C. circuit is grounded through the relatively small resistor 32. This forms no part of the invention, but is merely an expedient to prevent oscillations which otherwise might take place in the receiver elsewhere than in the tube 20. It has been the general practice to ground the A. V. C. circuit through a small resistor when beat frequency oscillations were provided for C. W. reception, even though a separate beat frequency oscillator was used.

The lead 31 is shown as incorporating one plate of a condenser 33, the other plate of which is connected to the control grid of the tube 20. This condenser and its connection to the control grid are shown in broken lines, because the condenser actually is provided merely by capacitance existing between the lead 31 and the grid terminal of the tube and its connecting lead. The lead 31 is shown also as incorporating one plate of another condenser 34, the other plate of which is connected to the anode of the tube 20, this condenser also being shown in broken lines, because it is provided by capacitance between the lead 31 and the anode terminal and anode lead of the tube.

The actual construction of the device is shown in Fig. 2, where the lead 31 is illustrated as a relatively long wire (the length is not at all critical) having one end connected to a terminal of the switch 19, and having the other end extending adjacent the control grid and anode terminals of the tube 20. In Fig. 2, the control grid terminal is designated 20*a* and the anode terminal is designated 20*b*. The conductor 31 is laid across the tube socket closely adjacent these terminals and is held in place by the wiring of certain of the terminals, as for example, by a wire 35 which extends between the cathode and suppressor grid terminals 20*c* and 20*d*. If desired, the anode lead which extends from the anode terminal to the output circuit 25 may be wrapped once or twice about the conductor 31 to increase the coupling.

While the conductor 31 is adjacent the grid and anode terminals, it is spaced from these terminals and is electrically insulated therefrom. I have found it advantageous to form the conductor 31 from relatively heavy wire, as for example No. 18 stranded wire, encased in relatively heavy insulation. The thickness of the insulation thus determines the spacing between the conductor 31 and the respective grid and anode terminals, and changing the thickness of this insulation may vary the amount of capacitive coupling provided.

In the operation of the device, when the switch 19 is in the position shown in Fig. 3, the conductor 31 is grounded, and it will consequently have no effect upon any circuit components, but will merely be a grounded wire lying across the bottom of the chassis 28. Consequently, the switch may be located at any desired point on the chassis 28 or the panel 10, and there is no necessity to crowd the parts together to minimize the amount of wires used to avoid intercircuit coupling. The intermediate frequency amplifier tube may be located at the rear of the chassis, leaving room at the front of the chassis for the tunable radio frequency circuits, while at the same time the switch 19 may be located on the front panel 10, since the length of the wire 31 does not effect its operation in providing interelectrode capacitance when desired, and has absolutely no effect on other circuits of the receiver.

When the switch 19 is thrown to the position other than that shown in Fig. 3, the A. V. C. circuit will be grounded through the resistor 32 and the ground connection of the conductor 31 will be broken, thus providing capacitive coupling between the control grid and anode terminals of the tube 29, the conductor acting as a common condenser plate and the respective grid and anode terminals acting as other condenser plates, as shown diagrammatically in Fig. 3. The capacitance added in this manner may be determined by the thickness of insulation on the conductor 31, the insulation determining the spacing between the conductor and the respective tube terminals. Preferably, for the tube type shown, in a receiver having an intermediate frequency of 455 kc. the construction and arrangement should be such that the conductor provides capacitance coupling between the anode and grid terminals having a capacitive value no greater than one micromicrofarad, and preferably only of the order of .1 or .2 micromicrofarad. The capacitive components of the tuned grid and anode circuits each have a value of the order of 80 micromicrofarads, so that the added capacitive coupling is in no event greater than 1% of this tuned circuit capacity, and preferably is only about 1/500 of the tuned circuit capacity. This is important for two principal reasons. First, the added capacitive coupling will only slightly detune the circuits, so that the beat frequency oscillations will be displaced from the resonant frequency of the tuned input and output circuits by a frequency in the audible range, preferably not in excess of the order of 1 kc. Secondly, the very small added capacitance, while it will throw the tube into oscillation, will result in relatively weak oscillations and will not impair the gain of the I. F. stage. If both input and output circuits were not tuned a much larger capacitance would have to be added to make the tube oscillate.

In a communications type receiver, as illustrated, the tuned circuits preferably have an acceptance selectivity such that they pass a band of about 8 kc. In the receiver illustrated, the selectivity curves of the tuned circuits provide an attenuation of 6 decibels at 4 kc. on either side of the center frequency, and consequently, in utilizing my improved beat frequency oscillator, the slight detuning of about half a kc., or one kc., provides no noticeable change in signal strength. With my improved arrangement, the operator can find the carrier with the beat frequency oscillator on, and then can throw the switch 19 to the position shown in Fig. 3 without detuning the receiver. Conversely, when the receiver is accurately tuned to the center frequency, moving the switch 19 to a position other than that shown in Fig. 3, to start the beat frequency oscillator operating, detunes the circuit just enough to give a desired audio beat note.

While I have shown and described one embodiment of my invention, it is to be understood that it is capable of many modifications. Changes, therefore, in the construction and arrangement may be made without departing from the spirit and scope of the invention as disclosed in the appended claims.

I claim:

1. Radio apparatus of the character described, comprising: an amplifier tube having grid and anode elements with grid and anode terminals connected respectively thereto; input and output circuits coupled to said respective elements, at least one of said circuits being tuned; a conductor extending adjacent said grid and anode terminals but spaced therefrom to provide a capacitive coupling between said grid and anode elements to cause said tube to oscillate; and switch means connected to said conductor for selectively grounding said conductor to cause the oscillations to cease.

2. Radio apparatus of the character described, comprising: an amplifier tube having grid and anode elements; input and output circuits coupled to said respective elements, at least one of said circuits being tuned; and having a capacitive component; means external of said tube providing capacitive coupling between said grid and anode elements to cause said tube to oscillate, said coupling having a capacitive value not in excess of one per cent of said capacitive component; and switch means for selectively grounding said coupling means to cause the oscillations to cease.

3. Radio apparatus of the character described, comprising: an amplifier tube having grid and anode elements; input and output circuits coupled to said respective elements, at least one of said circuits being tuned to provide a resonant frequency, said tuned circuit having a capacitive component; means external of said tube providing capacitive coupling between said grid and anode elements of a capacitive value of the order of one five-hundredth of said capacitive component to cause said tube to oscillate at a frequency displaced from said resonant frequency by a frequency in the audible range; and switch means for selectively grounding said coupling means to cause the oscillations to cease.

4. Radio apparatus of the character described, comprising: an amplifier tube having grid and anode elements; input and output circuits coupled to said respective elements, at least one of said circuits being tuned to provide a resonant frequency, said tuned circuit having a capacitive component; and said tuned circuit having an acceptance selectivity pattern of the order of several kilocycles; means external of said tube providing capacitive coupling between said grid and anode elements of a capacitive value equal to only a small fraction of said capacitive component to cause said tube to oscillate at a frequency displaced from said resonant frequency by a frequency in the audible range, said frequency of oscillation being within the selectivity pattern of said tuned circuit; and switch means for selectively grounding said coupling means to cause the oscillations to cease.

5. Apparatus of the character claimed in claim 4, wherein said coupling has a capacitive value of the order of one five-hundredth of said capacitive component and said frequency of oscillation is displaced from said resonant frequency by an audible frequency not in excess of the order of one kilocycle.

6. Radio apparatus of the character described, comprising: an amplifier tube having grid and anode elements; a tuned input circuit coupled to said grid; a tuned output circuit coupled to said anode, said circuits having the same resonant frequency; means external of said tube providing capacitive coupling between said grid and anode elements to cause said tube to oscillate, said coupling having a capacitive value no greater than one micromicrofarad; and switch means for selectively changing said coupling to cause oscillations to cease.

7. Radio apparatus of the character described, comprising: an amplifier tube having grid and anode elements; a tuned input circuit coupled to said grid; a tuned output circuit coupled to said anode, said circuits having the same resonant frequency; means external of said tube providing capacitive coupling between said grid and anode elements of a capacitive value not in excess of one per cent of said capacitive component to cause said tube to oscillate at a frequency displaced from said resonant frequency by a frequency in the audible range; and switch means for selectively changing said coupling to cause oscillations to cease.

8. Radio apparatus of the character described, comprising: an amplifier tube having grid and anode elements; a tuned input circuit coupled to said grid; a tuned output circuit coupled to said anode, said circuits having the same resonant frequency; and said tuned circuits each having a capacitive component; means external of said tube providing capacitive coupling between said grid and anode elements of a capacitive value of only a few tenths of a micromicrofarad to cause said tube to oscillate at a frequency displaced from said resonant frequency by a frequency in the audible range; and switch means for selectively removing said coupling.

9. Radio apparatus of the character described, comprising: an amplifier tube having grid and anode elements; a tuned input circuit coupled to said grid; a tuned output circuit coupled to said anode, said circuits having the same resonant frequency; means external of said tube providing capacitive coupling between said grid and anode elements of a capacitive value of the order of .2 micromicrofarad to cause said tube to be displaced from said resonant frequency by a frequency in the audible range, said frequency of oscillation being within the selectivity pattern of said tuned circuit; and switch means for selectively grounding said means.

10. Radio apparatus of the character described, comprising: an amplifier tube having grid and anode elements with grid and anode terminals connected respectively thereto; input and output circuits coupled to said respective elements, at least one of said circuits being tuned and having a capacitive component; a conductor extending adjacent said grid and anode terminals but spaced and electrically insulated therefrom and providing a capacitive coupling between said grid and anode elements having a capacitive value equal to only a small fraction of said capacitive component to cause said tube to oscillate; and switch means connected to said conductor for selectively grounding said conductor to remove said coupling.

11. Apparatus of the character claimed in claim 10, wherein said spacing is provided by relatively thick insulation which encases said conductor.

12. Radio apparatus of the character described, comprising: an amplifier tube having grid and anode elements with grid and anode terminals connected respectively thereto; input and output circuits coupled to said respective elements, at least one of said circuits being tuned to provide a resonant frequency, said tuned circuit having a capacitive component; an insulated conductor extending adjacent said grid and anode terminals but spaced and electrically insulated therefrom and providing a capacitive coupling between said grid and anode elements having a capacitive value of the order of one five-hundredth of said capacitive component to cause said tube to oscillate at a frequency displaced from said resonant frequency by a frequency in the audible range; and switch means connected to said conductor for selectively grounding said conductor to remove said coupling.

13. In a communications type receiver, a beat frequency oscillator comprising: an amplifier tube having grid and anode elements with grid and anode terminals connected respectively thereto; input and output circuits coupled to said respective elements, at least one of said circuits being tuned to provide a resonant frequency, said tuned circuit having a capacitive component, and said tuned circuit having an acceptance selectivity pattern of the order of several kilocycles; means external of said tube providing capacitive coupling between said grid and anode elements, said means comprising an insulated wire conductor extending adjacent said grid and anode terminals but spaced and electrically insulated therefrom and providing a coupling having a capacitive value equal to only a small fraction of said capacitive component to cause said tube to oscillate at a frequency displaced from said resonant frequency by a frequency in the audible range, said frequency of oscillation being within the selectivity pattern of said tuned circuit; and switch means connected to said conductor for selectively grounding said conductor to remove said coupling.

14. In a communications type receiver, a beat frequency oscillator comprising: an intermediate frequency amplifier tube having grid and anode elements with grid and anode terminals connected respectively thereto; a tuned input circuit coupled to said grid; a tuned output circuit coupled to said anode, said circuits having the same resonant frequency; a wire conductor extending adjacent said grid and anode terminals but spaced therefrom and providing a capacitive coupling having a capacitive value of only a few tenths of a micromicrofarad to cause said tube to oscillate at a frequency displaced from said resonant frequency by a frequency in the audible range; and a switch having one terminal connected to said conductor and another terminal connected to ground for selectively grounding said conductor to remove said coupling.

15. Apparatus of the character claimed in claim 14, wherein said capacitive coupling has a capacitive value of the order of .2 micromicrofarad, and wherein the frequency of oscillation is displaced from said resonant frequency by an audible frequency not in excess of the order of one kilocycle.

DONALD I. WILBUR.

REFERENCES CITED

The following references are of record in the file of this patent:

UNITED STATES PATENTS

| Number | Name | Date |
|---|---|---|
| 2,481,533 | Pratt | Sept. 13, 1949 |